(12) United States Patent
Park et al.

(10) Patent No.: US 12,389,679 B2
(45) Date of Patent: Aug. 12, 2025

(54) ORGANIC LIGHT-EMITTING DISPLAY DEVICE HAVING A GATE INSULATING WITH CONTROLLED NUMBER OF OXYGEN ATOMS

(71) Applicant: SAMSUNG DISPLAY CO., LTD., Yongin-si (KR)

(72) Inventors: Sangjin Park, Yongin-si (KR); Youngdae Kim, Yongin-si (KR); Jeongseon Kim, Yongin-si (KR); Sangjin Lee, Yongin-si (KR); Ahyeon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 100 days.

(21) Appl. No.: 18/321,413

(22) Filed: May 22, 2023

(65) Prior Publication Data

US 2023/0292553 A1 Sep. 14, 2023

Related U.S. Application Data

(63) Continuation of application No. 17/111,897, filed on Dec. 4, 2020, now Pat. No. 11,690,251.

(30) Foreign Application Priority Data

Apr. 29, 2020 (KR) .......................... 10-2020-0052899

(51) Int. Cl.
*H01L 29/08* (2006.01)
*G09G 3/3233* (2016.01)
(Continued)

(52) U.S. Cl.
CPC ......... *H10D 86/431* (2025.01); *G09G 3/3233* (2013.01); *H10K 59/1213* (2023.02);
(Continued)

(58) Field of Classification Search
CPC ........... H10K 59/1213; H10K 59/1201; G09G 3/3233; G09G 2320/0257; H01L 27/1237
(Continued)

(56) References Cited

U.S. PATENT DOCUMENTS 6,977,463 B2 12/2005 Sato
8,519,386 B2 8/2013 Cho et al.
(Continued)

FOREIGN PATENT DOCUMENTS

CN 103137709 A 6/2013
CN 110797413 A 2/2020
(Continued)

OTHER PUBLICATIONS

Hidetoshi Miyazaki, "Refractive Index and dielectric contrant of SiOx films deposited by reactive sputtering", Article in Physics and Chemistry of Glasses, Apr. 2010.
(Continued)

*Primary Examiner* — Phuc T Dang
(74) *Attorney, Agent, or Firm* — F. CHAU & ASSOCIATES, LLC

(57) ABSTRACT

An organic light-emitting display device includes a driving transistor configured to control current to an organic light-emitting diode from a power voltage line, a compensation transistor configured to diode-connect the driving transistor in response to a voltage applied to a compensation gate electrode of the driving transistor, and a gate insulating layer interposed between a driving active region of the driving transistor and the driving gate electrode, and between a compensation active region of the compensation transistor and the compensation gate electrode. A dielectric constant in a first portion of the gate insulating layer between the driving active region and the driving gate electrode is greater than a dielectric constant in a second portion of the gate insulating (Continued)

layer between the compensation active region and the compensation gate electrode.

15 Claims, 7 Drawing Sheets

(51) Int. Cl.
*H10D 86/40* (2025.01)
*H10K 59/121* (2023.01)
*H10K 71/00* (2023.01)
*H10D 86/60* (2025.01)
*H10K 59/12* (2023.01)
*H10K 71/40* (2023.01)

(52) U.S. Cl.
CPC ..... *H10K 71/00* (2023.02); *G09G 2300/0819* (2013.01); *G09G 2320/0257* (2013.01); *H10D 86/60* (2025.01); *H10K 59/1201* (2023.02); *H10K 71/40* (2023.02)

(58) Field of Classification Search
USPC .......................................................... 257/40
See application file for complete search history.

(56) References Cited

U.S. PATENT DOCUMENTS

| | | | |
|---|---|---|---|
| 9,053,961 | B2 | 6/2015 | Kaneko et al. |
| 9,214,478 | B2 | 12/2015 | Kim |
| 9,269,923 | B2 | 2/2016 | Choi et al. |
| 9,293,514 | B2 * | 3/2016 | Kwon ............... H01L 27/124 |
| 10,121,415 | B2 * | 11/2018 | Lee .................... G09G 3/3233 |
| 10,204,976 | B2 | 2/2019 | Kim et al. |
| 2006/0035452 | A1 | 2/2006 | Carcia et al. |
| 2006/0091474 | A1 | 5/2006 | Nabatame et al. |
| 2012/0049188 | A1 | 3/2012 | Park et al. |
| 2013/0153887 | A1 | 6/2013 | Kaneko et al. |
| 2015/0008395 | A1 | 1/2015 | Yoon et al. |
| 2015/0109553 | A1 | 4/2015 | Kubota |
| 2016/0064411 | A1 | 3/2016 | Park et al. |
| 2017/0330927 | A1 | 11/2017 | Lee et al. |
| 2019/0081170 | A1 | 3/2019 | Kumagi |
| 2019/0206969 | A1 | 7/2019 | Hwang et al. |
| 2020/0185233 | A1 | 6/2020 | Jintyou et al. |
| 2021/0343816 | A1 | 11/2021 | Park et al. |

FOREIGN PATENT DOCUMENTS

| | | | | |
|---|---|---|---|---|
| JP | 4163169 | B2 * | 10/2008 | ..... H01L 21/823842 |
| KR | 10-2016-0027332 | A | 3/2016 | |
| KR | 10-1651224 | | 8/2016 | |
| KR | 10-1718528 | | 3/2017 | |
| KR | 1020180116291 | | 10/2018 | |
| KR | 10-2019-0080546 | A | 7/2019 | |
| KR | 10-2057176 | | 12/2019 | |
| KR | 10-2075934 | | 2/2020 | |

OTHER PUBLICATIONS

Hyung-Jun Kim et al., "Assessment of wear performance of flame sprayed and fused Ni-based coatings", Surface and Coatings Technology 172 (2003) 262-269.

Nicolae Tomozeiu, "Silicon Oxide (SiOx, 0 x 2): a Challenging Material for Optoelectronics", www.intechopen.com, published Sep. 26, 2011.

Office Action dated Oct. 7, 2022 in corresponding U.S. Appl. No. 17/111,897.

Chinese Office Action cited in CN Patent Application No. 202110334704.2, dated Jan. 23, 2025.

* cited by examiner

ORGANIC LIGHT-EMITTING DISPLAY DEVICE HAVING A GATE INSULATING WITH CONTROLLED NUMBER OF OXYGEN ATOMS

CROSS-REFERENCE TO RELATED APPLICATION

This U.S. non-provisional patent application is a continuation of U.S. patent application Ser. No. 17/111,897 filed Dec. 4, 2020 that issued as U.S. Pat. No. 11,690,251 on Jun. 27, 2023, which claims the benefit of priority under 35 U.S.C. § 119 to Korean Patent Application No. 10-2020-0052899, filed on Apr. 29, 2020, in the Korean Intellectual Property Office, the disclosures of which are incorporated by reference in their entirety herein.

1. TECHNICAL FIELD

The present disclosure relates to an organic light-emitting display device and a method of manufacturing the same, and more particularly, to an organic light-emitting display device capable of displaying a high-quality image and a method of manufacturing the same.

2. DISCUSSION OF RELATED ART

A display device such as a flat-panel display (FPD) is an electronic device used by people to view content (e.g., still/moving images). An FPD device is far lighter, thinner, and uses less power than a traditional cathode ray tube (CRT) device. The display device includes a plurality of pixels, where each pixel includes a display element and a pixel circuit for controlling an electrical signal transmitted to the display element. The pixel circuit includes one or more transistors. The transistors may include a compensation transistor and a driving transistor. However, under certain circumstances, the compensation transistor contributes to a kick back voltage occurring at a gate node of the driving transistor, which causes an afterimage to be perceived. Thus, the quality of images generated by a display device including the pixel circuit needs to be improved.

SUMMARY

According to an exemplary embodiment of the disclosure, an organic light-emitting display device includes an organic light-emitting diode, a driving transistor, a compensation transistor, and a gate insulating layer. The driving transistor is configured to control, in response to a voltage applied to a first node connected to a driving gate electrode, an amount of current flowing to the organic light-emitting diode from a second node connected to a power voltage line. The compensation transistor is connected between a third node and the first node and configured to diode-connect the first transistor in response to a voltage applied to a compensation gate electrode. The third node is between the driving transistor and the organic light-emitting diode. The gate insulating layer is interposed between a driving active region of the driving transistor and a driving gate electrode of the driving transistor, and between a compensation active region of the compensation transistor and the compensation gate electrode. A dielectric constant in a first portion of the gate insulating layer between the driving active region and the driving gate electrode is greater than a dielectric constant in a second portion of the gate insulating layer between the compensation active region and the compensation gate electrode.

The second portion may overlap the compensation gate electrode and the compensation active region.

When viewed from a direction perpendicular to an upper surface of the compensation gate electrode, an area of the second portion may be the same as an area of a portion of the compensation gate electrode overlapping the compensation active region.

When viewed from a direction perpendicular to an upper surface of the compensation gate electrode, an area of the second portion may be larger than an area of a portion of the compensation gate electrode overlapping the compensation active region.

The gate insulating layer may include silicon oxide, and the number of oxygen atoms per unit volume in the second portion may be greater than the number of oxygen atoms per unit volume in the first portion.

The gate insulating layer may include silicon oxide, and the second portion may include fluorine or carbon.

The organic light-emitting display device may further include an initialization transistor connected between the first node and an initialization voltage line and configured to initialize a voltage of the driving gate electrode in response to a voltage applied to an initialization gate electrode, wherein the gate insulating layer may be interposed between an initialization active region of the initialization transistor and the initialization gate electrode, wherein the dielectric constant in the first portion of the gate insulating layer between the driving active region and the driving gate electrode may be greater than a dielectric constant in a third portion of the gate insulating layer between the initialization active region and the initialization gate electrode.

The third portion may overlap the initialization gate electrode and the initialization active region.

When viewed from a direction perpendicular to an upper surface of the initialization gate electrode, an area of the third portion may be the same as an area of a portion of the initialization gate electrode overlapping the initialization active region.

When viewed from a direction perpendicular to an upper surface of the initialization gate electrode, an area of the third portion may be larger than an area of a portion of the initialization gate electrode overlapping the initialization active region.

The gate insulating layer may include silicon oxide, and the number of oxygen atoms per unit volume in the third portion may be greater than the number of oxygen atoms per unit volume in the first portion.

The gate insulating layer may include silicon oxide, and the third portion may include fluorine or carbon.

The organic light-emitting display device may further include a second initialization transistor connected between the organic light-emitting diode and an initialization voltage line and configured to initialize a voltage of a pixel electrode of the organic light-emitting diode in response to a voltage applied to a second initialization gate electrode, wherein the gate insulating layer may be interposed between a second initialization active region of the second initialization transistor and the second initialization gate electrode, wherein the dielectric constant in the first portion of the gate insulating layer between the driving active region and the driving gate electrode may be greater than a dielectric constant in a fifth portion of the gate insulating layer between the second initialization active region and the second initialization gate electrode.

The fifth portion may overlap the second initialization gate electrode and the second initialization active region.

When viewed from a direction perpendicular to an upper surface of the seventh gate electrode, an area of the fifth portion may be the same as an area of a portion of the second initialization gate electrode overlapping the second initialization active region.

When viewed from a direction perpendicular to an upper surface of the second initialization gate electrode, an area of the fifth portion may be larger than an area of a portion of the second initialization gate electrode overlapping the second initialization active region.

The gate insulating layer may include silicon oxide, and the number of oxygen atoms per unit volume in the fifth portion may be greater than the number of oxygen atoms per unit volume in the first portion.

The gate insulating layer may include silicon oxide, and the fifth portion may include fluorine or carbon.

According to an exemplary embodiment of the disclosure, a method of manufacturing an organic light-emitting display device includes (i) forming, over a substrate, a semiconductor layer including a driving active region and a compensation active region, (ii) forming a gate insulating layer covering the semiconductor layer, (iii) injecting oxygen, fluorine, or carbon ions into a second portion of the gate insulating layer corresponding to the compensation active region, (iv) forming, on the gate insulating layer, a driving gate electrode corresponding to the driving active region and a compensation gate electrode corresponding to the compensation active region to form a driving transistor including the driving active region and the driving gate electrode and configured to control an amount of current flowing to an organic light-emitting diode, and a compensation transistor including the compensation active region and the compensation gate electrode and configured to diode-connect the driving transistor in response to a voltage applied to the compensation gate electrode, and (v) forming the organic light-emitting diode electrically connected to the driving transistor.

The forming of the semiconductor layer may include forming, over the substrate, a semiconductor layer including the driving active region, the compensation active region, and an initialization active region, wherein the injecting of the oxygen, fluorine, or carbon ions may include injecting oxygen, fluorine, or carbon ions into the second portion of the gate insulating layer corresponding to the compensation active region and a third portion of the gate insulating layer corresponding to the initialization active region, wherein the forming of the driving transistor and the compensation transistor may include forming, on the gate insulating layer, the driving gate electrode corresponding to the driving active region, the compensation gate electrode corresponding to the compensation active region, and an initialization gate electrode corresponding to the initialization active region to form the driving transistor including the driving active region and the driving gate electrode and configured to control an amount of current flowing to the organic light-emitting diode, the compensation transistor including the compensation active region and the compensation gate electrode and configured to diode-connect the driving transistor in response to a voltage applied to the compensation gate electrode, and an initialization transistor including the initialization active region and the initialization gate electrode and configured to initialize a voltage of the driving gate electrode in response to a voltage applied to the initialization gate electrode.

The forming of the gate insulating layer may include forming a gate insulating layer including silicon oxide.

According to an exemplary embodiment of the disclosure, a method of manufacturing an organic light-emitting display device includes (i) forming, over a substrate, a semiconductor layer including a driving active region and a compensation active region, (ii) forming a gate insulating layer covering the semiconductor layer, (iii) injecting silicon ions into a first portion of the gate insulating layer corresponding to the driving active region, (iv) forming, on the gate insulating layer, a driving gate electrode corresponding to the driving active region and a compensation gate electrode corresponding to the compensation active region to form a driving transistor including the driving active region and the driving gate electrode and configured to control an amount of current flowing to an organic light-emitting diode and a compensation transistor including the compensation active region and the compensation gate electrode and configured to diode-connect the driving transistor in response to a voltage applied to the compensation gate electrode, and (v) forming the organic light-emitting diode electrically connected to the driving transistor.

The injecting of the silicon ions may include injecting silicon ions into a portion excluding a second portion of the gate insulating layer, the second portion corresponding to the compensation active region.

The forming of the semiconductor layer may include forming, over the substrate, a semiconductor layer including the driving active region, the compensation active region, and an initialization active region, wherein the injecting of the silicon ions may include injecting silicon ions into a portion of the gate insulating layer excluding a second portion and a third portion of the gate insulating layer, wherein the second portion may correspond to the compensation active region, and the third portion may correspond to the initialization active region, wherein the forming of the driving transistor and the compensation transistor may include forming, on the gate insulating layer, the driving gate electrode corresponding to the driving active region, the compensation gate electrode corresponding to the compensation active region, and an initialization gate electrode corresponding to the initialization active region to form the driving transistor including the driving active region and the driving gate electrode and configured to control an amount of current flowing to the organic light-emitting diode, the compensation transistor including the compensation active region and the compensation gate electrode and configured to diode-connect the driving transistor in response to a voltage applied to the compensation gate electrode, and an initialization transistor including the initialization active region and the initialization gate electrode and configured to initialize a voltage of the driving gate electrode in response to a voltage applied to the initialization gate electrode.

The forming of the gate insulating layer may include forming a gate insulating layer including silicon oxide in which the number of oxygen atoms included per unit volume is 1.9 times or more the number of silicon atoms included per unit volume.

The second portion may overlap the compensation gate electrode and the compensation active region.

When viewed from a direction perpendicular to an upper surface of the semiconductor layer, an area of the second portion of the gate insulating layer may be the same as an area of a portion of the compensation gate electrode overlapping the compensation active region.

When viewed from a direction perpendicular to an upper surface of the semiconductor layer, an area of the second portion of the gate insulating layer may be larger than an area of a portion of the compensation gate electrode overlapping the compensation active region.

According to an exemplary embodiment of the disclosure, a pixel circuit for an organic light-emitting display device includes a driving transistor, a compensation transistor, and a gate insulating later. The driving transistor is a driving transistor configured to control current flowing to an organic light-emitting diode from a power voltage line. The compensation transistor is configured to diode-connect the driving transistor in response to a voltage applied to a compensation gate electrode of the compensation transistor. The gate insulating layer is interposed between a driving active region of the driving transistor and the driving gate electrode of the driving transistor, and between a compensation active region of the compensation transistor and the compensation gate electrode. A dielectric constant in a first portion of the gate insulating layer between the driving active region and the driving gate electrode is greater than a dielectric constant in a second portion of the gate insulating layer between the compensation active region and the compensation gate electrode.

In an embodiment, an area of the second portion is the same as an area of a portion of the compensation gate electrode overlapping the compensation active region. In an embodiment, an area of the second portion is larger than an area of a portion of the compensation gate electrode overlapping the compensation active region.

BRIEF DESCRIPTION OF THE DRAWINGS

The above and other aspects, features, and elements of certain embodiments of the disclosure will be more apparent from the following description taken in conjunction with the accompanying drawings, in which.

DETAILED DESCRIPTION

Figure 1:
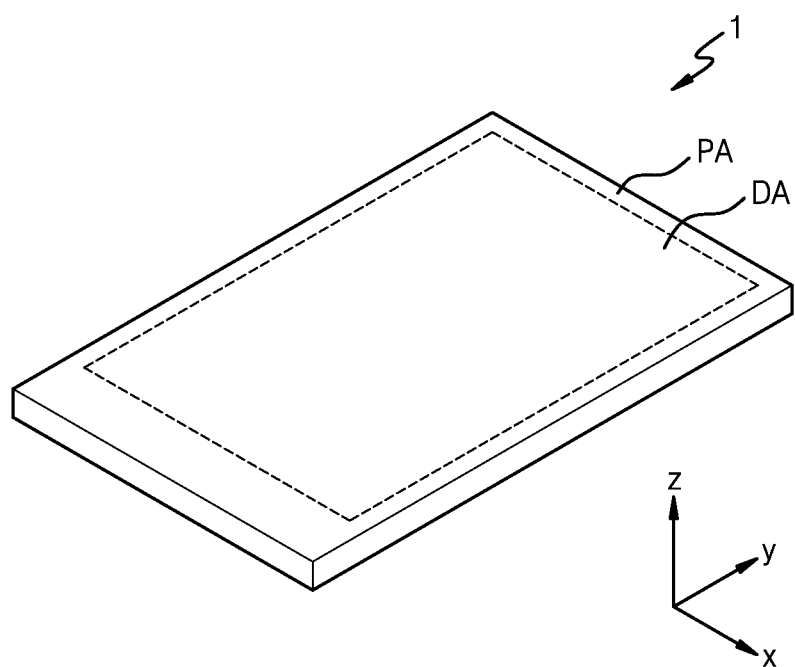
FIG. 1 is a schematic conceptual diagram illustrating a display device according to an exemplary embodiment of the disclosure.

Reference will now be made in detail to exemplary embodiments of the present disclosure, examples of which are illustrated in the accompanying drawings. Like reference numerals refer to like elements throughout the drawings and the specification. In this regard, the present invention may have different forms and should not be necessarily construed as being limited to the descriptions set forth herein. Accordingly, several exemplary embodiments are described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. The disclosure may, however, be embodied in many different forms and is not necessarily limited to the exemplary embodiments set forth herein.

In the embodiments described below, when a layer, film, region, or plate is referred to as being "on" another layer, film, region, or plate, it can be directly or indirectly on the other layer, film, region, or plate. That is, for example, intervening layers, films, regions, or plates may be present. Sizes of components in the drawings may be exaggerated or reduced for convenience of description. For example, since sizes and thicknesses of components in the drawings may be illustrated for convenience of description, the following embodiments are not necessarily limited thereto.

In the embodiments described below, when a wire is referred to as "extending in a first direction or a second direction", the wire may extend in a straight shape or may extend in a zigzag or curve along the first direction or the second direction.

In the embodiments described below, the phrase "in a plan view" refers to a case where a target portion is viewed from above, and the phrase "in a cross-sectional view" refers to a case where a vertical cross-section of a target portion is viewed from the side. In the embodiments described below, when a first component is referred to as "overlapping" a second component, the first component may be arranged above or below the second component.

FIG. 1 is a schematic conceptual diagram of a display device 1 according to an exemplary embodiment of the disclosure.

The display device 1 according to the present embodiment may be implemented as an electronic device such as a smartphone, a mobile phone, a navigation device, a games console, a television (TV), a vehicle head unit, a notebook computer, a laptop computer, a tablet computer, a personal media player (PMP), personal digital assistants (PDA), etc. Also, the electronic device may be a flexible device.

As shown in FIG. 1, the display device 1 according to the present embodiment has a display area DA and a peripheral area PA. The peripheral area PA may surround the display area DA. In an embodiment, the display area DA includes pixels for displaying an image and the peripheral area PA does not include pixels. The display device 1 may include a substrate 101 (refer to FIG. 5), and a shape of the substrate 101 is not limited to a rectangular shape (on an xy plane) shown in FIG. 1 and may have various shapes such as a circular shape. Also, the substrate 101 may have a bending area and be bent in the bending area. For example, the display device 1 may be bendable.

The substrate 101 may include glass or metal. Also, the substrate 101 may include various flexible or bendable materials. For example, the substrate 101 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

In an exemplary embodiment, the substrate 101 has a multilayer structure including two layers including the polymer resin described above and a barrier layer including an inorganic material between the two layers. For example, the barrier layer may include silicon oxide, silicon nitride and/or silicon oxynitride.

A plurality of display elements may be arranged in the display area DA. For example, the display element may be an organic light-emitting diode and may emit red, green, blue, or white light. A (sub-)pixel in the display area DA of the display device 1 of FIG. 1 includes such an organic light-emitting diode, and also includes a thin film transistor configured to control a degree to which the organic light-emitting diode emits light and a capacitor.

A driver and a wire (or line) such as a power supply wire may be arranged in the peripheral area PA. Also, the peripheral area PA may include a pad area which is an area to which various electronic devices such as a driving integrated circuit (IC) or a printed circuit board is electrically attached. The pad area may include pads (e.g., conductive elements). Various wires for transmitting electrical signals to the display area DA, the printed circuit board, or the driving IC may be attached to the pads.

Figure 2:
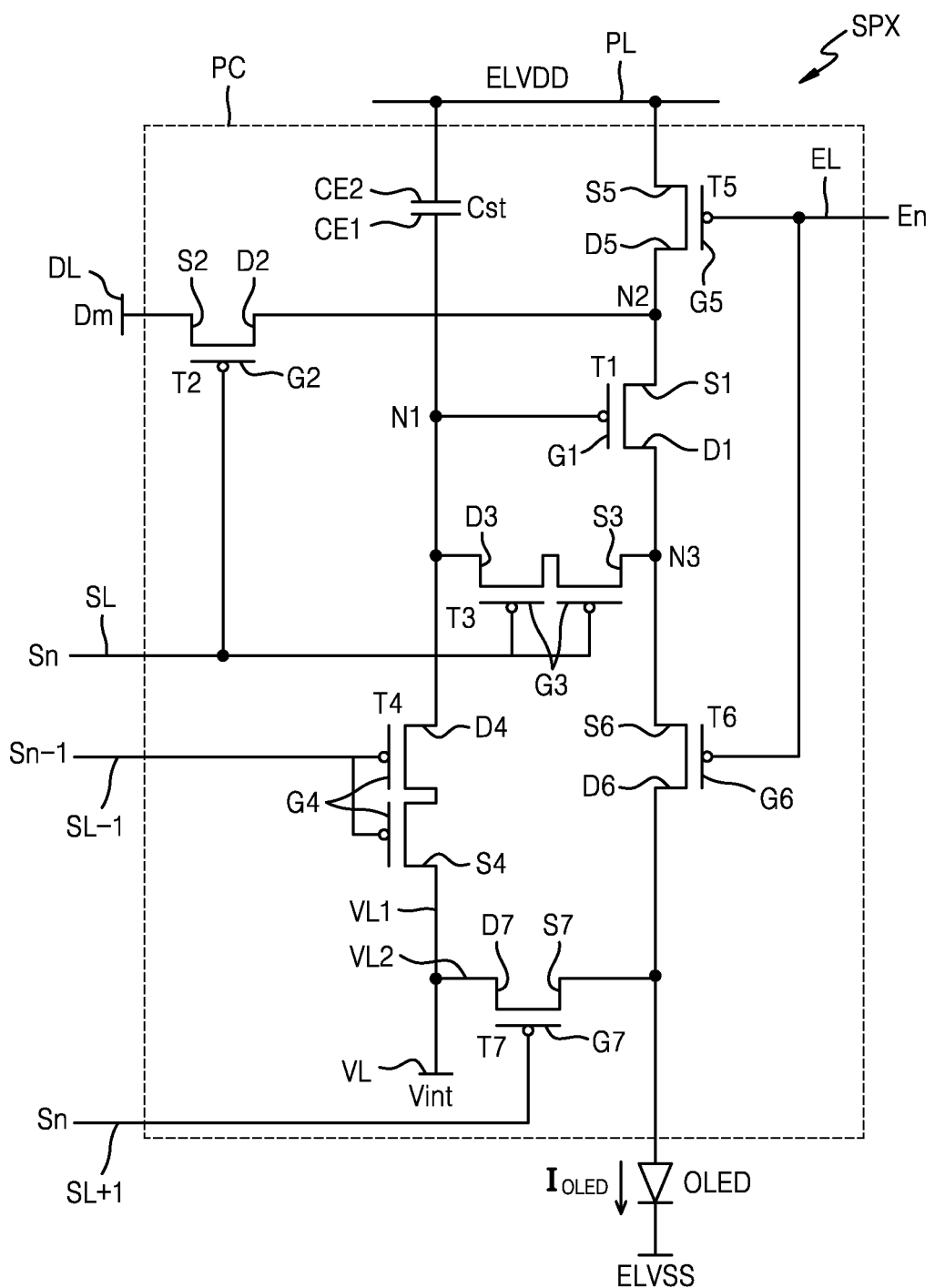
FIG. 2 is an equivalent circuit diagram illustrating a pixel included in the display device of FIG. 1 according to an exemplary embodiment of the disclosure.

FIG. 2 is an equivalent circuit diagram illustrating a (sub-)pixel in the display area DA of the display device 1 of FIG. 1 according an exemplary embodiment of the disclosure. The (sub-)pixel may refer to a pixel or a sub-pixel.

Referring to FIG. 2, a (sub-)pixel SPX includes an organic light-emitting diode OLED as a display element and a pixel circuit PC (or pixel circuit portion) connected to the organic light-emitting diode OLED. The pixel circuit PC may include a plurality of thin film transistors. For example, the thin film transistors may include first to seventh transistors T1 to T7 and a storage capacitor Cst. According to types (p-type or n-type) and/or operation conditions of transistors, a first terminal of each of the first to seventh transistors T1 to T7 may be a source terminal or a drain terminal, and a second terminal thereof may be different from the first terminal. For example, when the first terminal is a source terminal, the second terminal may be a drain terminal. In an embodiment, the first to seventh transistors T1 to T7 may be implemented by a p-channel multi-oxide semiconductor field effect transistor MOSFET or a p-channel metal oxide semiconductor (PMOS) transistor.

The first transistor T1 may be referred to as a driving transistor. The second transistor T2 may be referred to as a switching transistor. The third transistor T3 may be referred to as a compensation transistor. The fourth transistor T4 may be referred to as a first initialization transistor. The fifth transistor T5 may be referred to as an operation control transistor. The sixth transistor T6 may be referred to as an emission control transistor. The seventh transistor T7 may be referred to as a second initialization transistor. The thin film transistors and the storage capacitor Cst may be connected to signal lines, for example, a scan line SL, a previous scan line SL−1, a next scan line SL+1, an emission control line EL, and a data line DL, a first initialization voltage line VL1, a second initialization voltage line VL2, and a power voltage line PL.

The signal lines, for example, the scan line SL, the previous scan line SL−1, the next scan line SL+1, the emission control line EL, and the data line DL, may include the scan line SL configured to transmit a scan signal Sn, the previous scan line SL−1 configured to transmit a previous scan signal Sn−1 to the first initialization thin film transistor T4, the next scan line SL+1 configured to transmit the scan signal Sn to the second initialization thin film transistor T7, the emission control line EL configured to transmit an emission control signal En to the operation control thin film transistor T5 and the emission control thin film transistor T6, and the data line DL crossing the scan line SL and configured to transmit a data signal Dm. The power voltage line PL may be configured to transmit a driving voltage ELVDD to the driving thin film transistor T1. The first initialization voltage line VL1 may be configured to transmit an initialization voltage Vint to the first initialization thin film transistor T4. The second initialization voltage line VL2 may be configured to transmit the initialization voltage Vint to the second initialization thin film transistor T7.

A driving gate electrode G1 of the driving thin film transistor T1, is connected to a lower electrode CE1 of the storage capacitor Cst. A driving source region S1 of the driving thin film transistor T1 is connected to the power voltage line PL via the operation control thin film transistor T5. A driving drain region D1 of the driving thin film transistor T1 is electrically connected to a pixel electrode of an organic light-emitting diode OLED via the emission control thin film transistor T6. That is, in response to a voltage applied to a first node N1 (e.g., a voltage applied to the driving gate electrode G1), the driving thin film transistor T1 may control an amount of current flowing from a second node N2 connected to the power voltage line PL to the organic light-emitting diode OLED. Accordingly, the driving thin film transistor T1 receives the data signal Dm according to a switching operation of the switching thin film transistor T2 and supplies a driving current $I_{OLED}$ to the organic light-emitting diode OLED. The operation control thin film transistor T5 may be interposed between the second node N2 and the power voltage line PL.

A switching gate electrode G2 of the switching thin film transistor T2, is connected to the scan line SL. A switching source region S2 of the switching thin film transistor T2 is connected to the data line DL. A switching drain region D2 of the switching thin film transistor T2 is connected to the second node N2 and thus connected to the driving source region S1 of the driving thin film transistor T1 and is also connected to the power voltage line PL via the operation control thin film transistor T5. The switching thin film transistor T2 is turned on according to the scan signal Sn received through the scan line SL to perform a switching operation for transmitting the data signal Dm transmitted through the data line DL to the driving source region S1 of the driving thin film transistor T1.

The compensation thin film transistor T3, may be connected between a third node N3 between the driving thin film transistor T1 and the organic light-emitting diode OLED and the first node N1 to diode-connect the driving thin film transistor T1 in response to a voltage applied to a compensation gate electrode G3 of the compensation thin film transistor T3. The compensation gate electrode G3 of the compensation thin film transistor T3 is connected to the scan line SL. A compensation source region S3 of the compensation thin film transistor T3 is connected to the driving drain region D1 of the driving thin film transistor T1 and is also connected to the pixel electrode of the organic light-emitting diode OLED via the emission control thin film transistor T6. A compensation drain region D3 of the compensation thin film transistor T3 is connected to the lower electrode CE1 of the storage capacitor Cst, a first initialization drain region D4 of the first initialization thin film transistor T4, and the driving gate electrode G1 of the driving thin film transistor T1. The compensation thin film transistor T3 is turned on according to the scan signal Sn received through the scan line SL to electrically connect the driving gate electrode G1 and the driving drain region D1 of the driving thin film transistor T1 and diode-connect the driving thin film transistor T1.

The first initialization thin film transistor T4, may be connected between the first node N1 and the first initialization voltage line VL1 to initialize a voltage of the driving gate electrode G1 in response to a voltage applied to a first initialization gate electrode G4. The first initialization gate electrode G4 of the first initialization thin film transistor T4 is connected to the previous scan line SL−1. A first initialization source region S4 of the first initialization thin film transistor T4 is connected to the first initialization voltage line VL1. The first initialization drain region D4 of the first initialization thin film transistor T4 is connected to the lower electrode CE1 of the storage capacitor Cst, the compensation drain region D3 of the compensation thin film transistor T3, and the driving gate electrode G1 of the driving thin film transistor T1. The first initialization thin film transistor T4 is turned on according to the previous scan signal Sn−1 received through the previous scan line SL−1 to perform an initialization operation for initializing a voltage of the driving gate electrode G1 of the driving thin film transistor T1 by transmitting the initialization voltage Vint to the driving gate electrode G1 of the driving thin film transistor T1.

The operation control thin film transistor T5 may be connected between the second node N2 and the power voltage line PL and be turned on in response to a voltage applied to an operation control gate electrode G5. The operation control gate electrode G5 of the operation control thin film transistor T5 is connected to the emission control line EL. An operation control source region S5 of the operation control thin film transistor T5 is connected to the power voltage line PL. An operation control drain region D5 of the operation control thin film transistor T5 is connected to the driving source region S1 of the driving thin film transistor T1 and the switching drain region D2 of the switching thin film transistor T2.

The emission control thin film transistor T6 may be connected between the third node N3 and the organic light-emitting diode OLED and be turned on in response to a voltage applied to an emission control gate electrode G6, from the emission control line EL. The emission control gate electrode G6 of the emission control thin film transistor T6 is connected to the emission control line EL. An emission control source region S6 of the emission control thin film transistor T6 is connected to the driving drain region D1 of the driving thin film transistor T1 and the compensation source region S3 of the compensation thin film transistor T3. An emission control drain region D6 of the emission control thin film transistor T6 is electrically connected to a second initialization source region S7 of the second initialization thin film transistor T7 and the pixel electrode of the organic light-emitting diode OLED.

When the operation control thin film transistor T5 and the emission control thin film transistor T6 are simultaneously turned on (or turned on during a same period) according to the emission control signal En received through the emission control line EL, the driving voltage ELVDD is transmitted to the organic light-emitting diode OLED so that the driving current $I_{OLED}$ flows through the organic light-emitting diode OLED.

A second initialization gate electrode G7 of the second initialization thin film transistor T7, is connected to the next scan line SL+1. The second initialization source region S7 of the second initialization thin film transistor T7 is connected to the emission control drain region D6 of the emission control thin film transistor T6 and the pixel electrode of the organic light-emitting diode OLED. A second initialization drain region D7 of the second initialization thin film transistor T7 is connected to the second initialization voltage line VL2.

In an embodiment where the scan line SL and the next scan line SL+1 are electrically connected to each other, the same scan signal Sn is applied to the scan line SL and the next scan line SL+1. Accordingly, the second initialization thin film transistor T7 may be turned on according to the scan signal Sn received through the next scan line SL+1 to perform an operation of initializing the pixel electrode of the organic light-emitting diode OLED. If an exemplary embodiment, the second initialization thin film transistor T7 is omitted.

An upper electrode CE2 of the storage capacitor Cst is connected to the power voltage line PL, and a common electrode of the organic light-emitting diode OLED is connected to a common voltage ELVSS. Accordingly, the organic light-emitting diode OLED may receive the driving current $I_{OLED}$ from the driving thin film transistor T1 and emit light, thereby displaying an image. In an exemplary embodiment, the common voltage ELVSS is less than the driving voltage ELVDD.

Although FIG. 2 shows the compensation thin film transistor T3 and the first initialization thin film transistor T4 having dual gate electrodes, the compensation thin film transistor T3 and the first initialization thin film transistor T4 may have one gate electrode in other embodiments.

Figure 3:
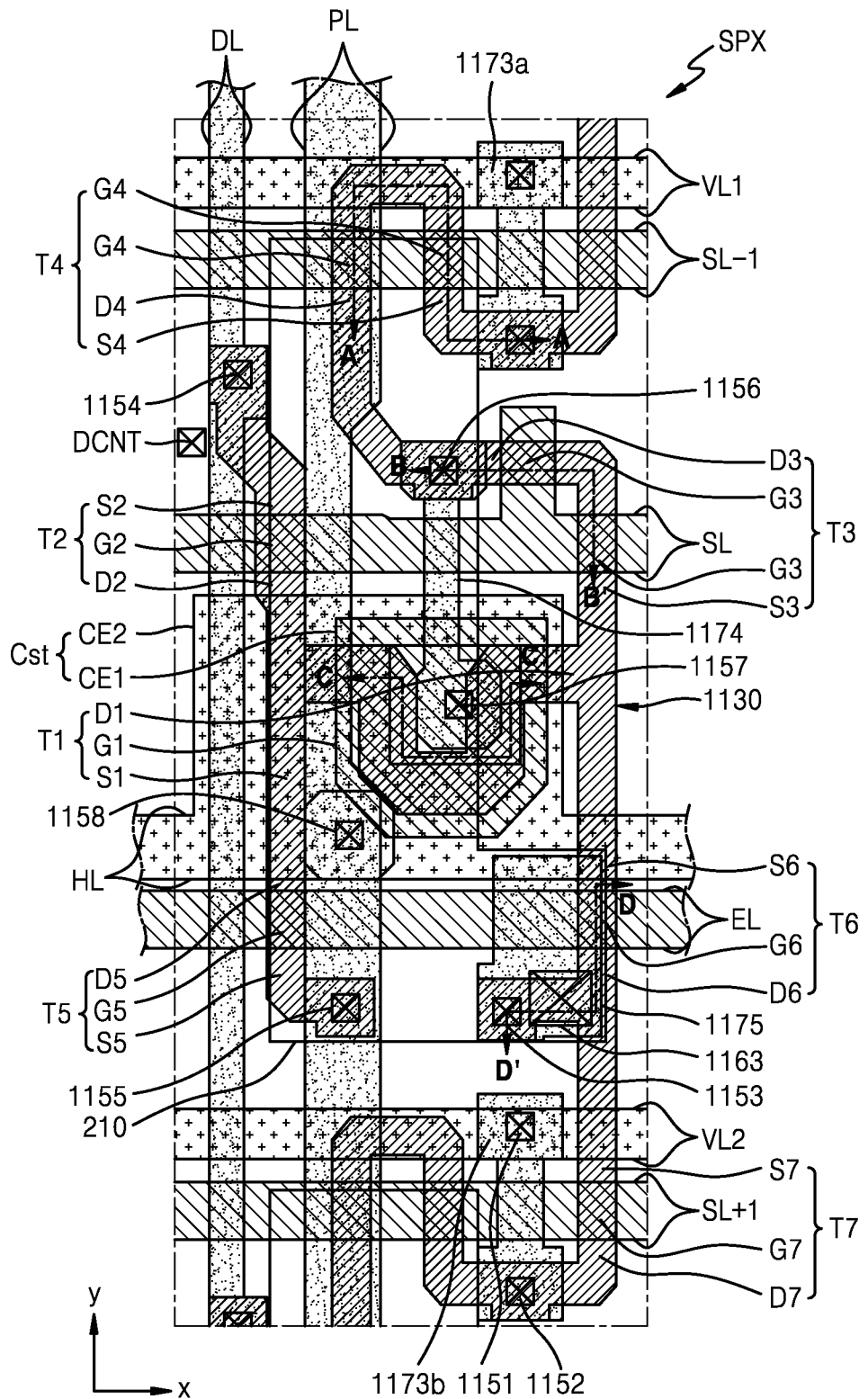
FIG. 3 is a schematic layout diagram illustrating positions of thin-film transistors and a capacitor in the pixel of FIG. 2 according to an exemplary embodiment of the disclosure.
Figure 4:
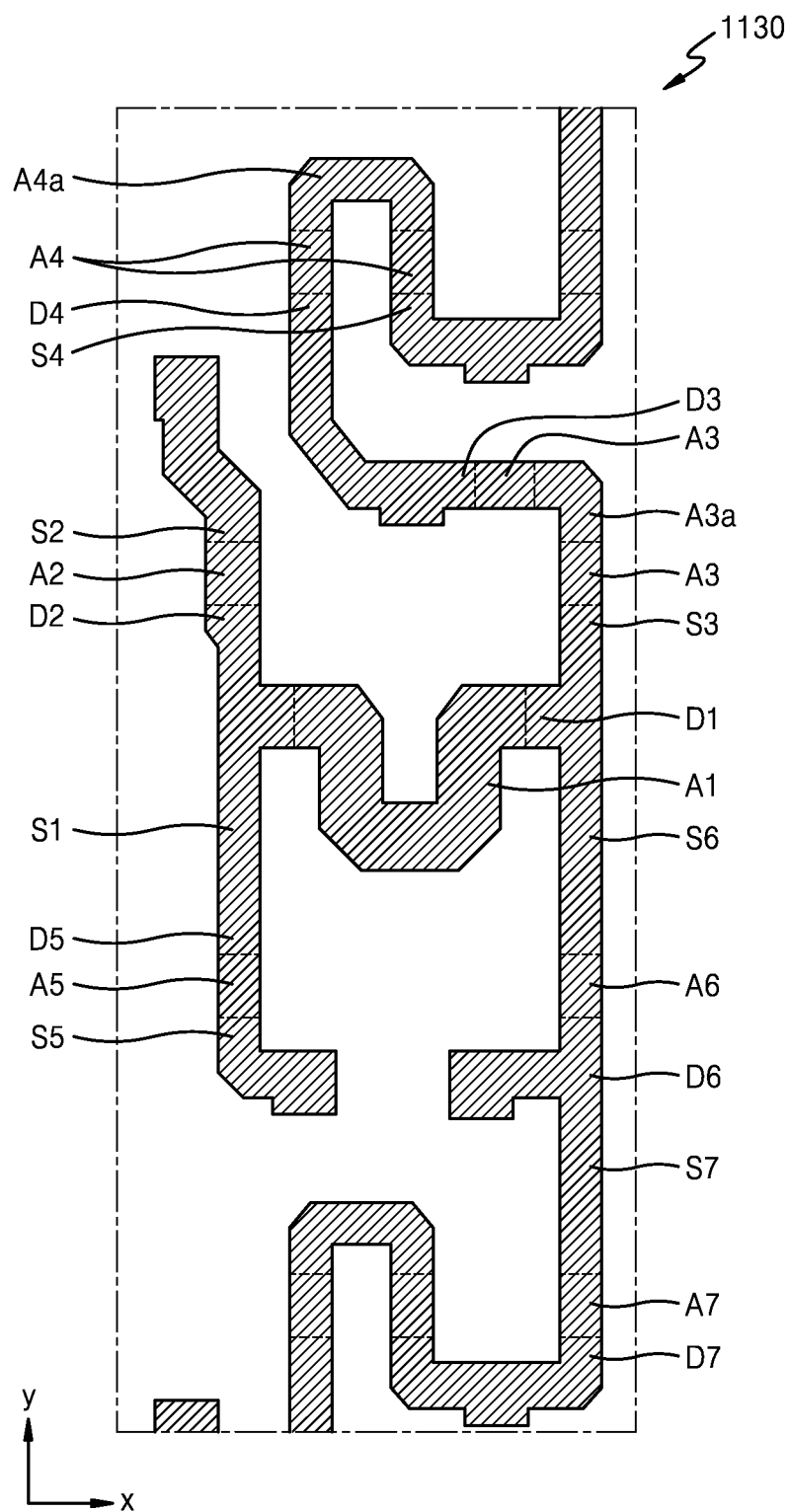
FIG. 4 is a schematic layout diagram illustrating a semiconductor layer of FIG. 3 according to an exemplary embodiment of the disclosure.
Figure 5:
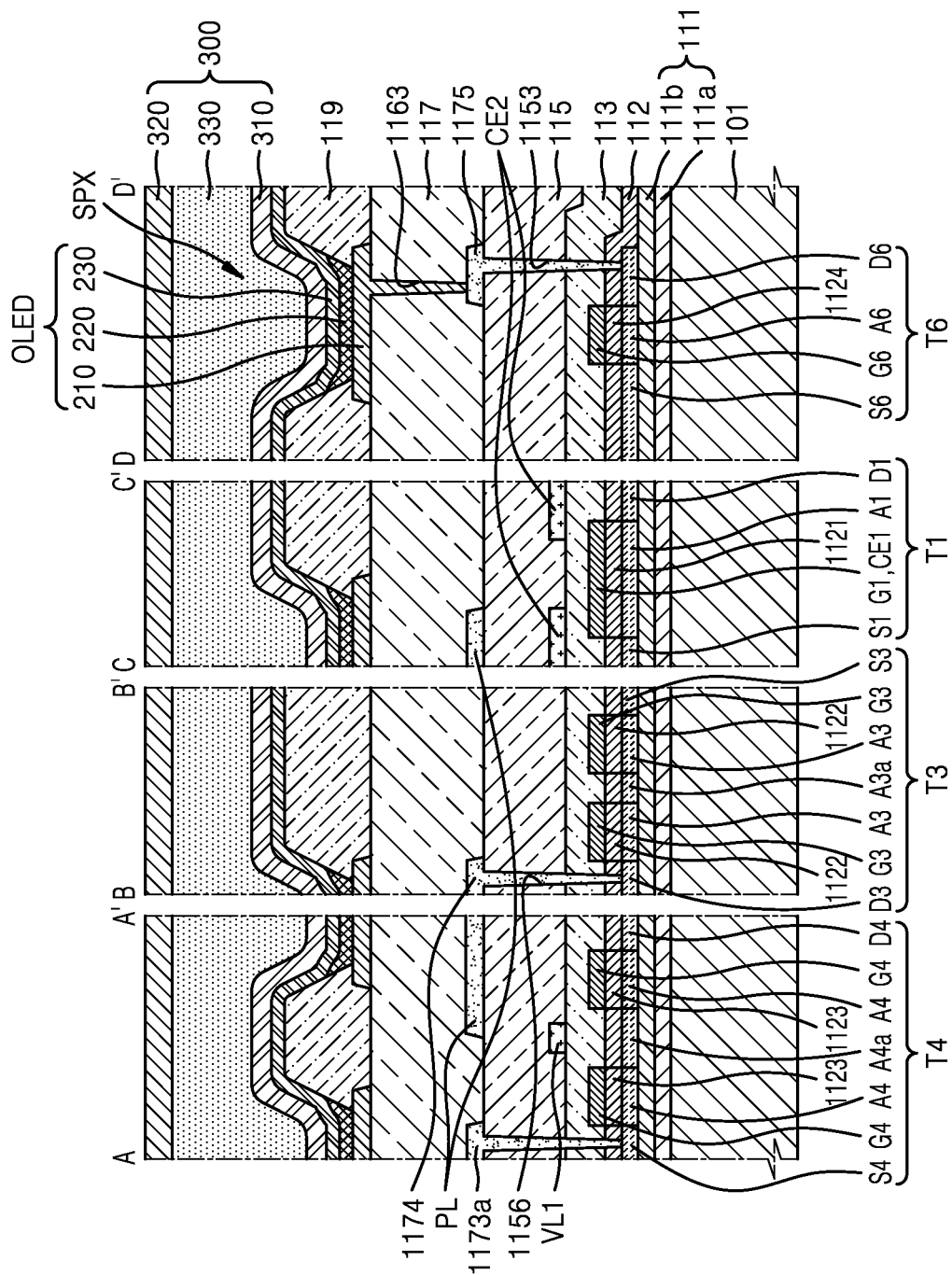
FIG. 5 is a schematic cross-sectional view illustrating a portion of FIG. 3 according to an exemplary embodiment of the disclosure.

FIG. 3 is a schematic layout diagram illustrating positions of a plurality of thin film transistors and a capacitor in the (sub-)pixel of FIG. 2 according to an exemplary embodiment of the disclosure. FIG. 4 is a schematic layout diagram of a semiconductor layer 1130, which is a portion of the display device of FIG. 3. FIG. 5 is a cross-sectional view of a portion of FIG. 3, taken along lines A-A', B-B', C-C', and D-D'. The size of each component in the cross-sectional view has been exaggerated and/or reduced for convenience. This also applies to the cross-sectional views described below.

The driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along the semiconductor layer 1130. Some areas of the semiconductor layer 1130 may constitute semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. That is, some areas of the semiconductor layer 1130 may constitute an active region, a source region, or a drain region of a thin film transistor.

The semiconductor layer 1130 may be on the substrate 101. A buffer layer 111 may be on the substrate 101, and the semiconductor layer 1130 may be on the buffer layer 111.

The buffer layer 111 may reduce or prevent penetration of foreign materials, moisture, or external air from the bottom of the substrate 101 and may provide a flat surface on the substrate 101. The buffer layer 111 may include an inorganic material such as oxide or nitride, an organic material, or an organic-inorganic complex material and may have a single-layer or multilayer structure of an inorganic material and an organic material. For example, the buffer layer 111 may have a structure in which a first buffer layer 111a and a second buffer layer 111b are stacked, and the first buffer layer 111a and the second buffer layer 111b may include different materials from each other. For example, the first buffer layer 111a may include silicon nitride, and the second buffer layer 111b may include silicon oxide.

As described above, in an embodiment where the first buffer layer 111a includes a silicon nitride material, the silicon nitride material includes hydrogen. Accordingly, carrier mobility of the semiconductor layer 1130 arranged on the buffer layer 111 may improve, and thus, electrical characteristics of the thin film transistor may improve. In an embodiment, the semiconductor layer 1130 may include a silicon material. In this embodiment, interface bonding characteristics between the semiconductor layer 1130 including silicon and the second buffer layer 111b including silicon oxide may improve, and thus, electrical characteristics of the thin film transistor may improve.

The semiconductor layer 1130 may include low temperature polysilicon or a Low Temperature Polycrystalline Silicon (LTPS). The polysilicon material has high electron mobility (100 cm$^2$/Vs or greater) and thus has low energy consumption and excellent reliability. As another example, the semiconductor layer 1130 may include amorphous silicon (a-Si) and/or an oxide semiconductor. Alternatively, some semiconductor layers of the plurality of thin film transistors may include LTPS, and some of the other semiconductor layers may include a-Si and/or an oxide semiconductor.

Source regions and drain regions of the semiconductor layer 1130 may be doped with impurities, and the impurities may include N-type impurities or P-type impurities. The source region and the drain region may correspond to a source electrode and a drain electrode, respectively. The source region and the drain region may be exchanged with each other according to properties of the thin film transistor. Hereinafter, the terms "source region" and "drain region" are used instead of the source electrode or the drain electrode. The equivalent circuit diagram of FIG. 2 shows certain portions of the semiconductor layer 1130 doped with P-type impurities to implement the thin film transistors as a p-channel multi-oxide semiconductor field effect transistors (MOSFETs) or p-channel metal oxide semiconductor (PMOS) transistors. Other portions of the semiconductor layer 1130 may also be doped with impurities to serve as wires configured to electrically connect the thin film transistors and/or the capacitor to each other.

A first gate insulating layer 112 may be arranged on the semiconductor layer 1130, and the driving gate electrode G1, the scan line SL, the previous scan line SL−1, the next scan line SL+1, and the emission control line EL may be arranged on the first gate insulating layer 112. The first gate insulating layer 112 may be disposed on the buffer layer 111. The first gate insulating layer 112 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

Areas of the scan line SL overlapping second and third active regions A2 and A3 of the switching and compensation thin film transistors T2 and T3 may be the switching and compensation gate electrodes G2 and G3, respectively. An area of the previous scan line SL−1 overlapping a fourth active region A4 of the first initialization thin film transistor T4 may be the first initialization gate electrode G4. An area of the next scan line SL+1 overlapping a seventh active region A7 (e.g., a second initialization active region) of the second initialization thin film transistor T7 may be the second initialization gate electrode G7. Areas of the emission control line EL overlapping fifth and sixth active regions A5 and A6 of the operation control and emission control thin film transistors T5 and T6 may be the operation control and emission control gate electrodes G5 and G6, respectively.

The driving gate electrode G1, the scan line SL, the previous scan line SL−1, the next scan line SL+1, and the emission control line EL may include a conductive material including molybdenum (Mo), aluminum (Al), copper (Cu), or titanium (Ti) and may have a multilayer or single-layer structure including the material described above. For example, the driving gate electrode G1, the scan line SL, the previous scan line SL−1, the next scan line SL+1, and the emission control line EL may have a multilayer structure of Mo/Al or may have a multilayer structure of Mo/Al/Mo.

A second gate insulating layer 113 may be arranged on the driving gate electrode G1, the scan line SL, the previous scan line SL−1, the next scan line SL+1, and the emission control line EL. The second gate insulating layer 113 may be disposed on the first gate insulating layer 112. The second gate insulating layer 113 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

An electrode voltage line HL, the first initialization voltage line VL1, and the second initialization voltage line VL2 may be arranged on the second gate insulating layer 113. The electrode voltage line HL may cover at least a portion of the driving gate electrode G1 and may constitute the storage capacitor Cst together with the driving gate electrode G1. In an exemplary embodiment, the electrode voltage line HL entirely covers the driving gate electrode G1.

The lower electrode CE1 of the storage capacitor Cst may be integrally formed with the driving gate electrode G1 of the driving thin film transistor T1. For example, the driving gate electrode G1 of the driving thin film transistor T1 may serve as the lower electrode CE1 of the storage capacitor Cst. An area of the electrode voltage line HL overlapping the driving gate electrode G1 may be the upper electrode CE2 of the storage capacitor Cst. Accordingly, the second gate insulating layer 113 may serve as a dielectric layer of the storage capacitor Cst.

The electrode voltage line HL, the first initialization voltage line VL1, and the second initialization voltage line VL2 may include a conductive material including molybdenum (Mo), aluminum (Al), copper (Cu), or titanium (Ti) and may have a multilayer or single-layer structure including the material described above. For example, the electrode voltage line HL, the first initialization voltage line VL1, and the second initialization voltage line VL2 may have a multilayer structure of Mo/Al or may have a multilayer structure of Mo/Al/Mo.

An interlayer insulating layer 115 is arranged on the electrode voltage line HL, the first initialization voltage line VL1, and the second initialization voltage line VL2. The interlayer insulating layer 115 may be disposed on the second gate insulating layer 113. The interlayer insulating layer 115 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

The data line DL, the power voltage line PL, first and second initialization connection lines 1173a and 1173b, a node connection line 1174, and a connection metal 1175 may be arranged on the interlayer insulating layer 115. The data line DL, the power voltage line PL, the node connection line 1174, and the connection metal 1175 may include a conductive material including molybdenum (Mo), aluminum (Al), copper (Cu), or titanium (Ti) and may have a multi-layer or single-layer structure including the material described above. For example, the data line DL, the power voltage line PL, the node connection line 1174, and the connection metal 1175 may have a multilayer structure of Ti/Al/Ti.

The data line DL may be connected to the switching source region S2 of the switching thin film transistor T2 through a contact hole 1154. A portion of the data line DL may correspond to the switching source region S2.

The power voltage line PL may be connected to the upper electrode CE2 of the storage capacitor Cst through a contact hole 1158 formed in the interlayer insulating layer 115. Accordingly, the electrode voltage line HL may have the same voltage level (a constant voltage) as the power voltage line PL. Also, the power voltage line PL may be connected to the operation control drain region D5 through a contact hole 1155.

The first initialization voltage line VL1 may be connected to the first initialization thin film transistor T4 through the first initialization connection line 1173a, and the second initialization voltage line VL2 may be connected to the second initialization thin film transistor T7 through the second initialization connection line 1173b. The first initialization voltage line VL1 and the second initialization voltage line VL2 may have the same constant voltage (for example, −2 V, etc.).

In an exemplary embodiment, one end of the node connection line 1174 is connected to the compensation drain electrode D3 through a contact hole 1156, and the other end is connected to the driving gate electrode G1 through a contact hole 1157.

The connection metal 1175 is connected to the sixth active region A6 of the emission control thin film transistor T6 through a contact hole 1153 passing through (e.g., penetrates) the interlayer insulating layer 115, the second gate insulating layer 113, and the first gate insulating layer 112. The connection metal 1175 is connected to a pixel electrode 210 of the organic light-emitting diode OLED through a contact hole 1163. Accordingly, the emission control thin film transistor T6 may be electrically connected to the pixel electrode 210 of the organic light-emitting diode OLED.

A planarization layer 117 may be arranged on the data line DL, the power voltage line PL, the first and second initialization connection lines 1173a and 1173b, the node connection line 1174, and the connection metal 1175. The organic light-emitting diode OLED may be arranged on the planarization layer 117.

Although FIG. 2 shows one pixel circuit PC, and FIG. 3 shows a structure of one (sub-)pixel SPX, a plurality of sub-pixels SPX having the same pixel circuit PC may be arranged in a first direction (x-axis direction) and a second direction (y-axis direction). A plurality of sub-pixels SPX may share lines. For example, the first initialization voltage line VL1, the previous scan line SL−1, the second initialization voltage line VL2, and the next scan line SL+1 may be shared by two pixel circuits PC adjacent to each other in the second direction (y-axis direction).

That is, the first initialization voltage line VL1 and the previous scan line SL−1 may be electrically connected to a second initialization thin film transistor of another pixel circuit PC arranged above (direction +y) the pixel circuit PC of FIG. 3 in the second direction (y-axis direction) based on the drawing. Accordingly, a previous scan signal applied to the previous scan line SL−1 may be transmitted to the second initialization thin film transistor of the other pixel circuit PC as a next scan signal. In the same manner, the second initialization voltage line VL2 and the next scan line SL+1 may be electrically connected to a first initialization thin film transistor of another adjacent pixel circuit PC arranged below (direction −y) the pixel circuit PC of FIG. 3 in the second direction (y-axis direction) and thus may transmit a previous scan signal and an initialization voltage to the first initialization thin film transistor of the other pixel circuit PC.

Referring back to FIG. 5, the planarization layer 117 may have a flat upper surface so that the pixel electrode 210 may be flat. The planarization layer 117 may include an organic material and may have a single-layer or multilayer structure. The planarization layer 117 may include a general commercial polymer such as benzocyclobutene (BCB), polyimide, hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an exemplary embodiment, the planarization layer 117 includes an inorganic material. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 includes an inorganic material, chemical planarization polishing may be performed in some embodiments. In some embodiments, the planarization layer 117 may include both of an organic material and an inorganic material.

The organic light-emitting diode OLED may include the pixel electrode 210, a common electrode 230, and an intermediate layer 220 interposed between the pixel electrode 210 and the common electrode 230 and including an emission layer.

The pixel electrode 210 may be connected to the connection metal 1175 through the contact hole 1163, and the connection metal 1175 may be connected to the emission control drain region D6 through the contact hole 1153. The pixel electrode 210 may be a (semi)transmissive electrode or a reflective electrode. In some embodiments, the pixel electrode 210 may include a reflective film including Ag, Mg, Al, Pt, Pd, Au, Ni, Nd, Jr, Cr, and a compound thereof and a transparent or semitransparent electrode layer disposed on the reflective film. The transparent or semitransparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a stack structure of ITO/Ag/ITO.

A pixel-defining layer 119 may be arranged on the planarization layer 117, and the pixel-defining layer 119 may have an opening portion exposing a center portion of the pixel electrode 210. Thus, the pixel-defining layer 119 may define an emission area of a pixel. Also, the pixel-defining layer 119 may prevent an arc from occurring at the edge of the pixel electrode 210 by increasing a distance between an edge of the pixel electrode 210 and the common electrode 230 arranged over the pixel electrode 210. The pixel-defining layer 119 may be formed by a method such as spin coating, using an organic insulating material such as polyimide, polyamide, acrylic resin, BCB, HMDSO, or phenol resin.

The intermediate layer 220 may include an organic emission layer. The organic emission layer may include an organic material including a fluorescent or phosphorescent material that emits red, green, blue, or white light. The organic emission layer may include a low-molecular weight organic material or a polymer organic material, and functional layers such as a hole transport layer (HTL), a hole injection layer (HIL), an electron transport layer (ETL), and an electron injection layer (EIL) may be selectively further arranged under and on the organic emission layer. The intermediate layer 220 may correspond to each of a plurality of pixel electrodes 210. However, embodiments of the disclosure are not limited thereto, and a layer such as an HTL, an HIL, an ETL, or an EIL from among layers included in the intermediate layer 220 may be integrally formed over the plurality of pixel electrodes 210.

The common electrode 230 may be a transmissive electrode or a reflective electrode. In an embodiment, the common electrode 230 may be a transparent or semitransparent electrode and may include a metal thin film having a low work function and including Li, Ca, LiF/Ca, LiF/Al, Al, Ag, Mg, and a compound thereof. In addition to the metal thin film, the common electrode 230 may further include a transparent conductive oxide (TCO) film such as ITO, IZO, ZnO, or $In_2O_3$. The common electrode 230 may be integrally formed to correspond to the plurality of pixel electrodes 210.

An encapsulation layer 300 including a first inorganic encapsulation layer 310, a second inorganic encapsulation layer 320, and an organic encapsulation layer 330 therebetween may be arranged on the common electrode 230.

The first inorganic encapsulation layer 310 and the second inorganic encapsulation layer 320 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The organic encapsulation layer 330 may include polyethylene terephthalate, polyethylene naphthalate, polycarbonate, polyimide, polyethylene sulfonate, polyoxymethylene, polyarylate, HMDSO, acrylic resin (for example, PMMA, polyacrylic acid, etc.), or any combination thereof.

As described above, the first gate insulating layer 112 may be arranged on the semiconductor layer 1130, and the driving gate electrode G1, the scan line SL, the previous scan line SL−1, the next scan line SL+1, and the emission control line EL may be arranged on the first gate insulating layer 112. The scan line SL, the previous scan line SL−1, the next scan line SL+1, and the emission control line EL, as described above, include the switching gate electrode G2, the compensation gate electrode G3, the first initialization gate electrode G4, the operation control gate electrode G5, the emission control gate electrode G6, and the second initialization gate electrode G7. Accordingly, the first gate insulating layer 112 is interposed between the driving gate electrode G1, the switching gate electrode G2, the compensation gate electrode G3, the first initialization gate electrode G4, the operation control gate electrode G5, the emission control gate electrode G6, and the second initialization gate electrode G7 and the semiconductor layer 1130.

In an organic light-emitting display device according to an exemplary embodiment of the disclosure, a dielectric constant in a first portion 1121 of the first gate insulating layer 112 between the first active region A1 (e.g., a driving active region) and the driving gate electrode G1 is greater than a dielectric constant in a second portion 1122 of the first gate insulating layer 112 between the third active region A3 (e.g., a compensation active region) and the compensation gate electrode G3.

As described above with reference to FIG. 2, the driving thin film transistor T1 receives the data signal Dm according to a switching operation of the switching thin film transistor T2 and supplies the driving current $I_{OLED}$ to the organic light-emitting diode OLED. That is, a voltage between the driving gate electrode G1 and the driving source region S1 of the driving thin film transistor T1 determines the driving current $I_{OLED}$ flowing through the organic light-emitting diode OLED. In this regard, when threshold voltages Vth of driving thin film transistors T1 of several pixels are different from each other, sizes of driving currents $I_{OLED}$ flowing through organic light-emitting diodes OLED are different from each other even if the same data signal Dm is applied to those several pixels. A display device may be unable to display a high-quality image when the sizes of the driving currents $I_{OLED}$ flowing through organic light-emitting diodes are different from each other while the same data signal Dm is applied to those several pixels.

The compensation thin film transistor T3 may be connected to each of the driving thin film transistors T1 to prevent the influence of the threshold voltages Vth in the driving thin film transistors T1. Thus, even if the threshold voltages Vth of the driving thin film transistors T1 of several pixels are different from each other, sizes of the driving currents $I_{OLED}$ flowing through the organic light-emitting diodes OLED may be almost the same as each other when the same data signal Dm is applied to those several pixels.

However, even with the compensation thin film transistor T3, the pixels may be unable to display a high-quality image. After compensating for a threshold voltage Vth in a voltage difference between the driving gate electrode G1 and the driving source region S1 of the driving thin film transistor T1, the compensation thin film transistor T3 is completely turned off to prevent a current flowing in a direction from the driving thin film transistor T1 to the organic light-emitting diode OLED from flowing to the compensation thin film transistor T3 at the third node N3. However, even when the compensation thin film transistor T3 is turned off, a leakage current flowing from the compensation source region S3 of the compensation thin film transistor T3 to the compensation drain region D3 exists. When sizes of such leakage currents are different from each other in the compensation thin film transistors T3, sizes of the driving currents $I_{OLED}$ flowing through the organic light-emitting diodes OLED are different from each other even if the same data signal Dm is applied to several pixels. A display device may be unable to display a high-quality image when the sizes of the driving currents $I_{OLED}$ flowing through the organic light-emitting diodes OLED are different from each other while the same data signal Dm is applied to several pixels.

Furthermore, a parasitic capacitance may exist between the third active region A3 and the compensation gate electrode G3 of the compensation thin film transistor T3, thereby resulting in a kick-back phenomenon occurring in the display device. The kick-back phenomenon refers to a flicker phenomenon in which a screen of the display device flickers, or a phenomenon that a residual image remains on the screen.

However, in an organic light-emitting display device according to at least one exemplary embodiment of the disclosure, a dielectric constant in the first portion 1121 of the first gate insulating layer 112 between the first active region A1 and the driving gate electrode G1 is greater than a dielectric constant in the second portion 1122 of the first gate insulating layer 112 between the third active region A3 and the compensation gate electrode G3. That is, a dielectric constant in the second portion 1122 of the first gate insulating layer 112 between the third active region A3 and the compensation gate electrode G3 is less than a dielectric constant in the first portion 1121 of the first gate insulating layer 112 between the first active region A1 and the driving gate electrode G1.

When a dielectric constant in the second portion 1122 of the first gate insulating layer 112 between the third active region A3 and the compensation gate electrode G3 decreases, a parasitic capacitance between the third active region A3 and the compensation gate electrode G3 may decrease, and thus, the kick-back phenomenon may be prevented or reduced, and a size of leakage current in the compensation thin film transistor T3 may decrease. When sizes of leakage currents in the compensation thin film transistors T3 decrease, a difference in the sizes of leakage currents in the compensation thin film transistors T3 also decreases. Accordingly, a display device according to at least one exemplary embodiment of the disclosure may display a high-quality image.

In an exemplary embodiment, a dielectric constant in a fourth portion 1124 of the first gate insulating layer 112 between the sixth active region A6 and the emission control gate electrode G6 is the same as a dielectric constant in the first portion 1121 of the first gate insulating layer 112 between the first active region A1 and the driving gate electrode G1. This also applies to the embodiments described later and modifications thereof.

As shown in FIG. 5, the second portion 1122 of the first gate insulating layer 112 between the third active region A3 and the compensation gate electrode G3 may be a portion where the compensation gate electrode G3 and the third active region A3 overlap each other. When the compensation gate electrode G3 and the third active region A3 are referred to as overlapping each other, it means that the compensation gate electrode G3 and the third active region A3 overlap each other when viewed from a direction perpendicular to the substrate 101 or a direction perpendicular to an upper surface of the compensation gate electrode G3. As shown in FIGS. 3 to 5, when the compensation thin film transistor T3 has dual gate electrodes, the first gate insulating layer 112 may have two second portions 1122 spaced apart from each other in the compensation thin film transistor T3.

As described above, parasitic capacitance in the compensation thin film transistor T3 occurs between the compensation gate electrode G3 and the third active region A3. Accordingly, when viewed from a direction perpendicular to the substrate 101 or a direction perpendicular to an upper surface of the compensation gate electrode G3, an area of the second portion 1122 having a lower dielectric constant than the first portion 1121 in the first gate insulating layer 112 may be at least the same as an area of a portion of the compensation gate electrode G3 overlapping the third active region A3.

Figure 6:
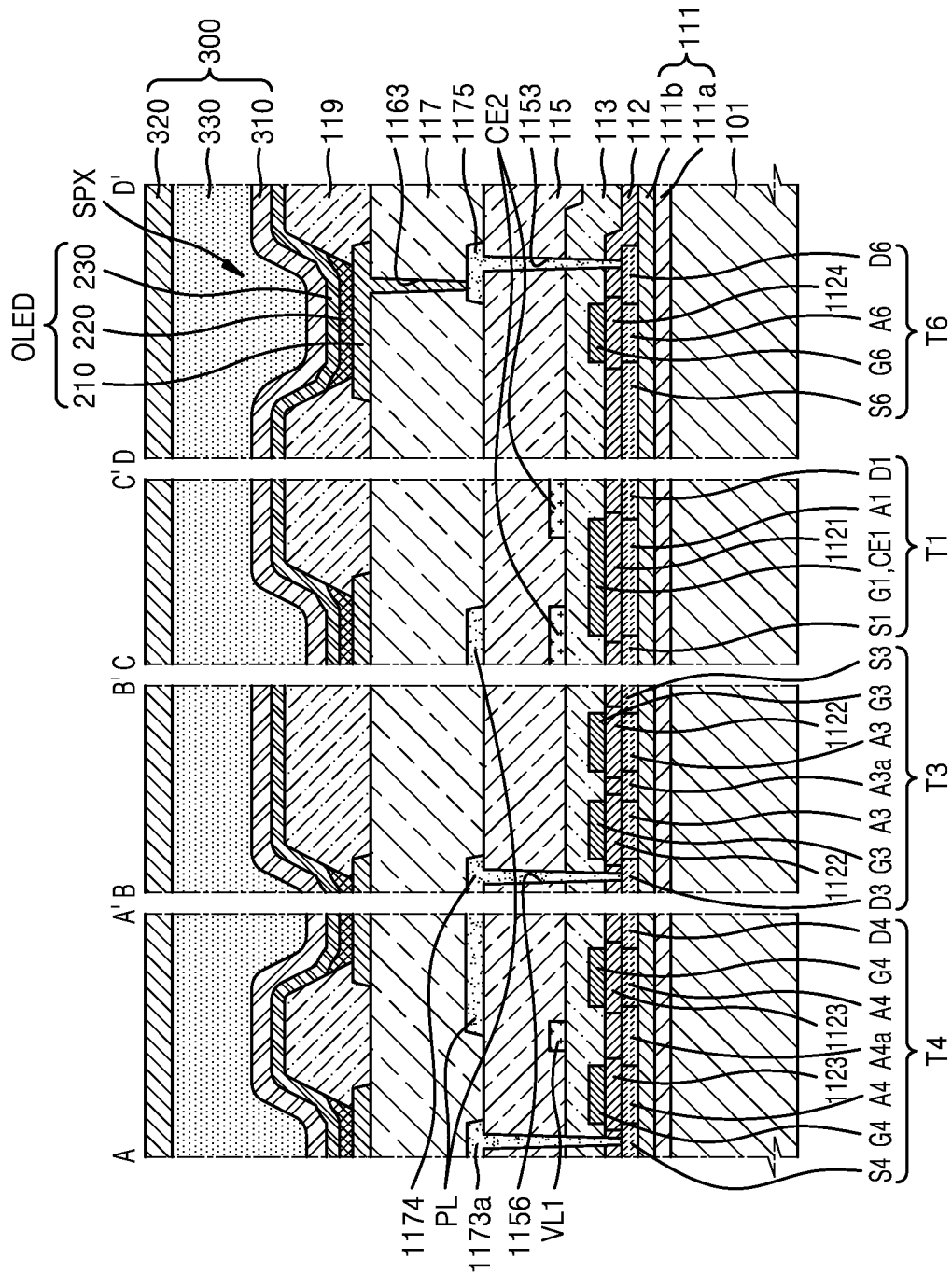
FIG. 6 is a schematic cross-sectional view illustrating a portion of a display device according to an exemplary embodiment of the disclosure.

In two components arranged on different layers, parasitic capacitance does not only occur between portions of the components overlapping each other in a direction perpendicular to the substrate 101. Accordingly, to reduce parasitic capacitance, as shown in FIG. 6, which is a schematic cross-sectional view of a portion of a display device according to an exemplary embodiment, when viewed from a direction perpendicular to the substrate 101 or a direction perpendicular to an upper surface of the compensation gate electrode G3, an area of the second portion 1122 having a lower dielectric constant than the first portion 1121 in the first gate insulating layer 112 is larger than an area of a portion of the compensation gate electrode G3 overlapping the third active region A3.

Figure 7:
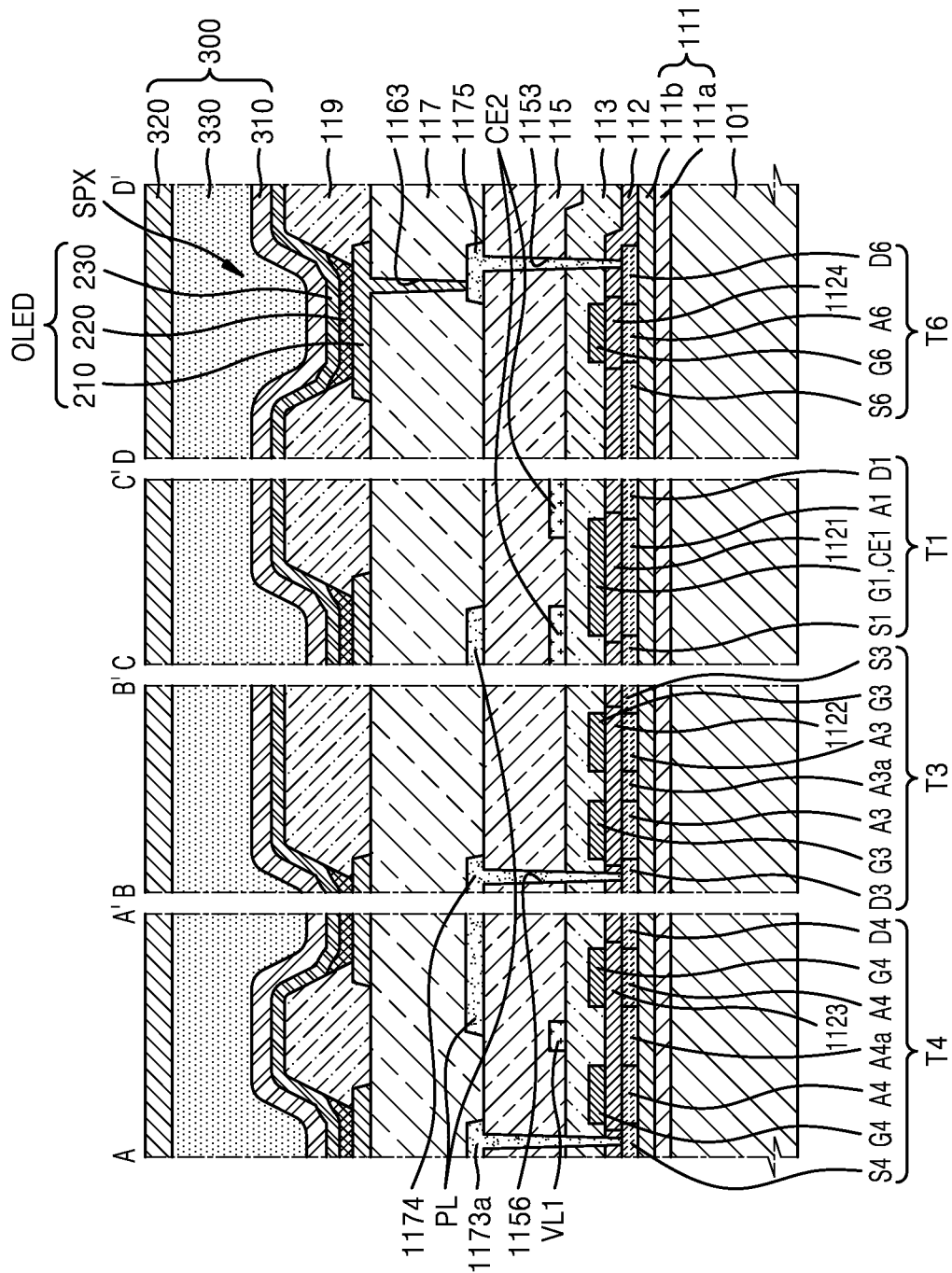
FIG. 7 is a schematic cross-sectional view illustrating a portion of a display device according to an exemplary embodiment of the disclosure.

Furthermore, as shown in FIG. 7, which is a schematic cross-sectional view of a portion of a display device according to exemplary embodiment, in the compensation thin film transistor T3 having dual gate electrodes, the second portion 1122 having a lower dielectric constant than the first portion 1121 in the first gate insulating layer 112 may correspond to not only compensation gate electrodes G3 spaced apart from each other but also a portion between the compensation gate electrodes G3 (i.e., a region A3$a$ between two third active regions A3).

Thus, a kick-back phenomenon in the compensation thin film transistor T3 may be prevented or reduced, and a size of leakage current in the compensation thin film transistor T3 may decrease. When sizes of leakage currents in the compensation thin film transistors T3 decrease, a difference in the sizes of leakage currents in the compensation thin film transistors T3 also decreases. Accordingly, a display device according to at least one exemplary embodiment of the disclosure may display a high-quality image.

In an exemplary embodiment of the disclosure, a dielectric constant in the second portion 1122 of the first gate insulating layer 112 between the third active region A3 and the compensation gate electrode G3 is less than that in the first portion 1121 of the first gate insulating layer 112 between the first active region A1 and the driving gate electrode G1 through various methods.

When the first gate insulating layer 112 includes silicon oxide, the number of oxygen atoms per unit volume in the second portion 1122 may be greater than the number of oxygen atoms per unit volume in the first portion 1121 so that a dielectric constant in the second portion 1122 is less than that in the first portion 1121. Silicon oxide may be denoted as SiOx, where x is the number of oxygen atoms per silicon atom. When x is 1.6 to 1.8 in SiOx, a dielectric constant of silicon oxide is 4.6 to 4.7. When x is 1.9 to 2.0 in SiOx, a dielectric constant of silicon oxide is 4.0 or less. Accordingly, as the number of oxygen atoms per unit volume in a silicon oxide layer increases, a dielectric constant of the silicon oxide layer decreases, and as a result, a size of parasitic capacitance may be reduced. The reason why a dielectric constant of a silicon oxide layer decreases as the number of oxygen atoms per unit volume in the silicon oxide layer increases is that binding energy increases and a polarization phenomenon due to an electric field decreases as an amount of oxygen increases.

When the first gate insulating layer 112 includes silicon oxide, the second portion 1122 may include fluorine or carbon so that a dielectric constant in the second portion 1122 is less than that in the first portion 1121. That is, the first portion 1121 of the first gate insulating layer 112 may include SiOx, and the second portion 1122 may include SiOF or SiOC. In the case of SiO$_2$, the dielectric constant is about 4.2, whereas, in the case of SiOF or SiOC, if the atomic percent of F or C is 3.1, the dielectric constant is 3.8, and if the atomic percent of F or C is 7.0, the dielectric constant is 3.4, and if the atomic percent of F or C is 10.0, the dielectric constant is 3.3. Accordingly, when the first gate insulating layer 112 includes silicon oxide, the second portion 1122 may include fluorine or carbon so that a dielectric constant in the second portion 1122 is less than the dielectric constant in the first portion 1121.

While the driving thin film transistor T1 and the compensation thin film transistor T3 have been mainly described, the above descriptions may be applied to the first initialization thin film transistor T4 in addition to the compensation thin film transistor T3.

The first initialization thin film transistor T4 initializes a voltage of the driving gate electrode G1 of the driving thin film transistor T1. However, since a leakage current exists in the first initialization thin film transistor T4 after the first initialization thin film transistor T4 is turned off, a voltage of the driving gate electrode G1 of the driving thin film transistor T1 may vary unintentionally. Particularly, when sizes of leakage currents of first initialization thin film transistors T4 are different from each other in a plurality of pixels, degrees to which voltages of driving gate electrodes G1 vary are different from each other in the plurality of pixels. This eventually causes quality degradation of an image displayed by a display device.

In an exemplary embodiment, a dielectric constant in the first portion 1121 of the first gate insulating layer 112 between the first active region A1 and the driving gate electrode G1 is greater than a dielectric constant in a third portion 1123 of the first gate insulating layer 112 between the fourth active region A4 (e.g., an initialization region) and the first initialization gate electrode G4, to prevent the image degradation. That is, a dielectric constant in the third portion 1123 of the first gate insulating layer 112 between the fourth active region A4 and the first initialization gate electrode G4 may be less than a dielectric constant in the first portion 1121 of the first gate insulating layer 112 between the first active region A1 and the driving gate electrode G1.

When a dielectric constant in the third portion 1123 of the first gate insulating layer 112 between the fourth active region A4 and the first initialization gate electrode G4 decreases, a parasitic capacitance between the fourth active region A4 and the first initialization gate electrode G4 may decrease, and thus, a size of leakage current in the first initialization thin film transistor T4 may decrease. When sizes of leakage currents in the first initialization thin film transistors T4 decrease, a difference in the sizes of leakage currents in the first initialization thin film transistors T4 also decreases. Accordingly, a display device according to at least one exemplary embodiment may display a high-quality image.

As shown in FIG. 5, the third portion 1123 of the first gate insulating layer 112 between the fourth active region A4 and the first initialization gate electrode G4 may be a portion where the first initialization gate electrode G4 and the fourth active region A4 overlap each other. When the first initialization gate electrode G4 and the fourth active region A4 are referred to as overlapping each other, it means that the first initialization gate electrode G4 and the fourth active region A4 overlap each other when viewed from a direction perpendicular to the substrate 101 or a direction perpendicular to an upper surface of the first initialization gate electrode G4. As shown in FIGS. 3 to 5, when the first initialization thin film transistor T4 has dual gate electrodes, the first gate insulating layer 112 may have two third portions 1123 spaced apart from each other in the first initialization thin film transistor T4.

As described above, parasitic capacitance in the first initialization thin film transistor T4 occurs between the first initialization gate electrode G4 and the fourth active region A4. Accordingly, when viewed from a direction perpendicular to the substrate 101 or a direction perpendicular to an upper surface of the first initialization gate electrode G4, an area of the third portion 1123 having a lower dielectric constant than the first portion 1121 in the first gate insulating layer 112 is at least the same as an area of a portion of the first initialization gate electrode G4 overlapping the fourth active region A4.

In two components arranged on different layers, parasitic capacitance does not only occur between portions of the components overlapping each other in a direction perpendicular to the substrate 101. Accordingly, to reduce parasitic capacitance, as shown in FIG. 6, which is a schematic cross-sectional view of a portion of a display device according to an exemplary embodiment, when viewed from a direction perpendicular to the substrate 101 or a direction perpendicular to an upper surface of the first initialization gate electrode G4, an area of the third portion 1123 having a lower dielectric constant than the first portion 1121 in the first gate insulating layer 112 is larger than an area of a portion of the first initialization gate electrode G4 overlapping the fourth active region A4.

Furthermore, as shown in FIG. 7, which is a schematic cross-sectional view of a portion of a display device according to an exemplary embodiment, in the first initialization thin film transistor T4 having dual gate electrodes, the third portion 1123 having a lower dielectric constant than the first portion 1121 in the first gate insulating layer 112 may correspond to not only first initialization gate electrodes G4 spaced apart from each other but also a portion between the first initialization gate electrodes G4 (i.e., a region A4a between two fourth active regions A4).

Thus, a size of leakage current in the first initialization thin film transistor T4 may decrease. When sizes of leakage currents in the first initialization thin film transistors T4 decrease, a difference in the sizes of leakage currents in the first initialization thin film transistors T4 also decreases. Accordingly, a display device according to at least one exemplary embodiment may display a high-quality image.

In an exemplary embodiment, a dielectric constant in the third portion 1123 of the first gate insulating layer 112 between the fourth active region A4 and the first initialization gate electrode G4 is made less than that a dielectric constant in the first portion 1121 of the first gate insulating layer 112 between the first active region A1 and the driving gate electrode G1 through one of various methods. As described above, when the first gate insulating layer 112 includes silicon oxide, the number of oxygen atoms per unit volume in the third portion 1123 may be greater than the number of oxygen atoms per unit volume in the first portion 1121 so that a dielectric constant in the third portion 1123 is less than a dielectric constant in the first portion 1121. Alternatively, when the first gate insulating layer 112 includes silicon oxide, the third portion 1123 may include fluorine or carbon so that a dielectric constant in the third portion 1123 is less than that in the first portion 1121. That is, the first portion 1121 of the first gate insulating layer 112 may include SiOx, and the third portion 1123 may include SiOF or SiOC.

The above descriptions related to the first initialization thin film transistor T4 may also be applied to the second initialization thin film transistor T7.

The second initialization thin film transistor T7 may be turned on according to the scan signal Sn received through the next scan line SL+1 to perform an operation of initializing a pixel electrode of the organic light-emitting diode OLED. However, since a leakage current exists in the second initialization thin film transistor T7 after the second initialization thin film transistor T7 is turned off, a current flowing to the organic light-emitting diode OLED may vary unintentionally. Particularly, when sizes of leakage currents of second initialization thin film transistors T7 are different from each other in a plurality of pixels, degrees to which currents flowing to the organic light-emitting diodes OLED vary are different from each other in the plurality of pixels. This may eventually cause quality of an image displayed by a display device to degrade.

In an exemplary embodiment, a dielectric constant in the first portion 1121 of the first gate insulating layer 112 between the first active region A1 and the driving gate electrode G1 is greater than a dielectric constant in a fifth portion of the first gate insulating layer 112 between the seventh active region A7 and the second initialization gate electrode G7, to prevent degradation of the image quality. That is, a dielectric constant in the fifth portion of the first gate insulating layer 112 between the seventh active region A7 and the second initialization gate electrode G7 is less than a dielectric constant in the first portion 1121 of the first gate insulating layer 112 between the first active region A1 and the driving gate electrode G1. For reference, a structure of the seventh active region A7, the second initialization gate electrode G7, and the fifth portion in a cross-sectional view may be the same as that of the sixth active region A6, the emission control gate electrode G6, and the fourth portion 1124 shown in the cross-sectional views of FIGS. 5 to 7. This also applies to the embodiments described later and modifications thereof.

When a dielectric constant in the fifth portion of the first gate insulating layer 112 between the seventh active region A7 and the second initialization gate electrode G7 decreases, a parasitic capacitance between the seventh active region A7 and the second initialization gate electrode G7 may decrease, and thus, a size of leakage current in the second initialization thin film transistor T7 may decrease. When sizes of leakage currents in the second initialization thin film transistors T7 decrease, a difference in the sizes of leakage currents in the second initialization thin film transistors T7 also decreases. Accordingly, a display device according to at least one exemplary embodiment may display a high-quality image.

The fifth portion of the first gate insulating layer 112 between the seventh active region A7 and the second initialization gate electrode G7 may be a portion where the second initialization gate electrode G7 and the seventh active region A7 overlap each other. When the second initialization gate electrode G7 and the seventh active region A7 are referred to as overlapping each other, it means that the second initialization gate electrode G7 and the seventh active region A7 overlap each other when viewed from a direction perpendicular to the substrate 101 or a direction perpendicular to an upper surface of the second initialization gate electrode G7.

As described above, parasitic capacitance in the second initialization thin film transistor T7 may occur between the second initialization gate electrode G7 and the seventh active region A7. Accordingly, when viewed from a direction perpendicular to the substrate 101 or a direction perpendicular to an upper surface of the second initialization gate electrode G7, an area of the fifth portion having a lower dielectric constant than the first portion 1121 in the first gate insulating layer 112 is at least the same as an area of a portion of the second initialization gate electrode G7 overlapping the seventh active region A7 according to an exemplary embodiment. That is, as an area of the fourth portion 1124 of the first gate insulating layer 112 is the same as an area of a portion of the emission control gate electrode G6 overlapping the sixth active region A6 in FIG. 5, an area of the fifth portion having a lower dielectric constant than the first portion 1121 in the first gate insulating layer 112 is the same as an area of a portion of the second initialization gate electrode G7 overlapping the seventh active region A7.

In two components arranged on different layers, parasitic capacitance does not only occur between portions of the components overlapping each other in a direction perpendicular to the substrate 101. When viewed from a direction perpendicular to the substrate 101 or a direction perpendicular to an upper surface of the second initialization gate electrode G7, an area of the fifth portion having a lower dielectric constant than the first portion 1121 in the first gate insulating layer 112 is larger than an area of a portion of the second initialization gate electrode G7 overlapping the seventh active region A7, to reduce parasitic capacitance. That is, as an area of the fourth portion 1124 of the first gate insulating layer 112 is larger than an area of a portion of the emission control gate electrode G6 overlapping the sixth active region A6 in FIG. 6, an area of the fifth portion having a lower dielectric constant than the first portion 1121 in the first gate insulating layer 112 is larger than an area of a portion of the second initialization gate electrode G7 overlapping the seventh active region A7.

Thus, a size of leakage current in the second initialization thin film transistor T7 may decrease. When sizes of leakage currents in the second initialization thin film transistors T7 decrease, a difference in the sizes of leakage currents in the second initialization thin film transistors T7 also decreases. Accordingly, a display device according to at least exemplary embodiment may display a high-quality image.

In an exemplary embodiment, a dielectric constant in the fifth portion of the first gate insulating layer 112 between the seventh active region A7 and the second initialization gate electrode G7 is made less than a dielectric constant in the first portion 1121 of the first gate insulating layer 112 between the first active region A1 and the driving gate electrode G1 through one of various methods. As described above, when the first gate insulating layer 112 includes silicon oxide, the number of oxygen atoms per unit volume in the fifth portion may be greater than the number of oxygen atoms per unit volume in the first portion 1121 so that a dielectric constant in the fifth portion is less than a dielectric constant in the first portion 1121. Alternatively, when the first gate insulating layer 112 includes silicon oxide, the fifth portion may include fluorine or carbon so that a dielectric constant in the fifth portion is less than a dielectric constant in the first portion 1121. That is, the first portion 1121 of the first gate insulating layer 112 may include SiOx, and the fifth portion may include SiOF or SiOC.

While a display device according to an exemplary has been described, the disclosure is not limited thereto. It will be understood that a method of manufacturing such a display device also falls within the scope of the disclosure.

For example, as shown in FIG. 4, the semiconductor layer 1130 having the first active region A1 and the third active region A3 is formed over the substrate 101, and the first gate insulating layer 112 covering the semiconductor layer 1130 is formed. The first gate insulating layer 112 may include, for example, silicon oxide. In addition, oxygen, fluorine, or carbon ions may be injected into the second portion 1122 of the first gate insulating layer 112 corresponding to the third active region A3.

Oxygen, fluorine, or carbon ions may be injected into the second portion 1122 of the first gate insulating layer 112 corresponding to the third active region A3 by forming a mask layer covering the first gate insulating layer 112 but exposing only the second portion 1122 with a photoresist, and injecting oxygen, fluorine, or carbon ions into the first gate insulating layer 112 or by performing a remote plasma treatment. Afterwards, the mask layer may be removed, and a heat treatment may be performed to activate the injected ions.

Afterwards, the driving gate electrode G1 corresponding to the first active region A1 and the compensation gate electrode G3 corresponding to the third active region A3 may be formed on the first gate insulating layer 112 to form the driving thin film transistor T1 having the first active region A1 and the driving gate electrode G1 and configured to control an amount of the driving current $I_{OLED}$ flowing to the organic light-emitting diode OLED and the compensation thin film transistor T3 having the third active region A3 and the compensation gate electrode G3. The compensation thin film transistor T3 may be configured to diode-connect the driving thin film transistor T1 in response to a voltage applied to the compensation gate electrode G3, and then, the organic light-emitting diode OLED electrically connected to the driving thin film transistor T1 may be formed to manufacture an organic light-emitting display device.

As shown in FIG. 4, the semiconductor layer 1130 may be formed over the substrate 101 to have the fourth active region A4 in addition to the first active region A1 and the third active region A3, and the first gate insulating layer 112 covering the semiconductor layer 1130 may be formed. The first gate insulating layer 112 may include, for example, silicon oxide. In addition, oxygen, fluorine, or carbon ions may be injected into the third portion 1123 of the first gate insulating layer 112 corresponding to the fourth active region A4.

Injecting oxygen, fluorine, or carbon ions into the third portion 1123 of the first gate insulating layer 112 corresponding to the fourth active region A4 may be performed in the same way as injecting oxygen, fluorine, or carbon ions into the second portion 1122 of the first gate insulating layer 112 corresponding to the third active region A3. Oxygen, fluorine, or carbon ions may be simultaneously injected into the second portion 1122 and the third portion 1123 during the same process.

Afterwards, when the driving gate electrode G1 corresponding to the first active region A1 and the compensation gate electrode G3 corresponding to the third active region A3 are formed on the first gate insulating layer 112, the first initialization gate electrode G4 may also be simultaneously formed with the same material used to form the driving thin film transistor T1, the compensation thin film transistor T3, and the first initialization thin film transistor T4. Then, the organic light-emitting diode OLED electrically connected to the driving thin film transistor T1 may be formed to manufacture an organic light-emitting display device.

The display device may be manufactured in a manner different from that described above. For example, in a method of manufacturing a display device, according to an exemplary embodiment, as shown in FIG. 4, the semiconductor layer 1130 having the first active region A1 and the third active region A3 is formed over the substrate 101, and the first gate insulating layer 112 covering the semiconductor layer 1130 is formed. The first gate insulating layer 112 may include, for example, silicon oxide. Afterwards, in an embodiment of the method, silicon ions are injected into the first portion 1121 of the first gate insulating layer 112 corresponding to the first active region A1. That is, when the first gate insulating layer 112 is formed, a silicon oxide layer may be formed to have a large number of oxygen atoms per unit volume, and silicon ions may be injected into the first portion 1121 having a relatively high dielectric constant in the first gate insulating layer 112. Thus, a dielectric constant in the first portion 1121 may be increased. For example, when the first gate insulating layer 112 is formed, a layer including silicon oxide may be formed so that the number of oxygen atoms included per unit volume is 1.9 times or more the number of silicon atoms included per unit volume.

Silicon ions may be injected into the first portion 1121 of the first gate insulating layer 112 corresponding to the first active region A1 by forming a mask layer covering the first gate insulating layer 112 but exposing only the first portion 1121 with a photoresist, and injecting oxygen, fluorine, or carbon ions into the first gate insulating layer 112 or performing a remote plasma treatment. Afterwards, the mask layer may be removed, and a heat treatment may be performed to activate the injected ions.

In an exemplary embodiment of the method, silicon ions are injected into a portion of the first gate insulating layer 112 excluding the second portion 1122 of the first gate insulating layer 112. In this embodiment, a mask layer may be arranged only on the second portion 1122 of the first gate insulating layer 112 to prevent the silicon ion from being injected into the second portion 1122.

Afterwards, the driving gate electrode G1 corresponding to the first active region A1 and the compensation gate electrode G3 corresponding to the third active region A3 may be formed on the first gate insulating layer 112 to form the driving thin film transistor T1 having the first active region A1 and the driving gate electrode G1 and configured to control an amount of the driving current $I_{OLED}$ flowing to the organic light-emitting diode OLED and the compensation thin film transistor T3 having the third active region A3 and the compensation gate electrode G3. The compensation thin film transistor T3 is configured to diode-connect the driving thin film transistor T1 in response to a voltage applied to the compensation gate electrode G3. Then, the organic light-emitting diode OLED electrically connected to the driving thin film transistor T1 may be formed to manufacture an organic light-emitting display device.

As shown in FIG. 4, the semiconductor layer 1130 may be formed over the substrate 101 to have the fourth active region A4 in addition to the first active region A1 and the third active region A3, and the first gate insulating layer 112 covering the semiconductor layer 1130 may be formed. The first gate insulating layer 112 may include silicon oxide having a large number of oxygen atoms per unit volume. In addition, silicon ions may be injected into the first portion 1121 of the first gate insulating layer 112 corresponding to the first active region A1.

Silicon ions may be injected into a portion excluding the second portion 1122 and the third portion 1123 of the first gate insulating layer 112. In this case, a mask layer is arranged only on the second portion 1122 and the third portion 1123 of the first gate insulating layer 112.

Afterwards, when the driving gate electrode G1 corresponding to the first active region A1 and the compensation gate electrode G3 corresponding to the third active region A3 are formed on the first gate insulating layer 112, the first initialization gate electrode G4 may also be simultaneously formed with the same material to form the driving thin film transistor T1, the compensation thin film transistor T3, and the first initialization thin film transistor T4. Then, the organic light-emitting diode OLED electrically connected to the driving thin film transistor T1 may be formed to manufacture an organic light-emitting display device.

In an exemplary embodiment of the disclosure, an area of the second portion 1122 and/or an area of the third portion 1123 of the first gate insulating layer 112 is the same as the areas described above with reference to FIGS. 5 to 7.

A treatment, such as injecting oxygen, fluorine, or carbon ions into the third portion 1123 of the first gate insulating layer 112 corresponding to the fourth active region A4, in the manufacturing method described above may also be applied to the fifth portion of the first gate insulating layer 112 corresponding to the seventh active region A7.

According to at least one of the above-described embodiments, an organic light-emitting display device configured to display a high-quality image and a method of manufacturing the organic light-emitting display device configured to display a high-quality image may be implemented. However, embodiments of the disclosure are not limited to providing higher quality images and may provide other benefits.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. An organic light-emitting display device comprising:
   an organic light-emitting diode;
   a first transistor configured to control, in response to a voltage applied to a first node connected to a first gate electrode of the first transistor, an amount of current flowing to the organic light-emitting diode from a second node connected to a power voltage line;
   a third transistor connected between the first node and a third node, and configured to diode-connect the first transistor in response to a voltage applied to a third gate electrode of the third transistor, wherein the third node is between the first transistor and the organic light-emitting diode;
   a first gate insulating portion interposed between a first active region of the first transistor and the first gate electrode; and
   a second gate insulating portion interposed between a third active region of the third transistor and the third gate electrode,
   wherein a number of oxygen atoms per unit volume in the first gate insulating portion is different from a number of oxygen atoms per unit volume in the second gate insulating portion.

2. The organic light-emitting display device of claim 1, wherein the second gate insulating portion overlaps the third gate electrode and the third active region.

3. The organic light-emitting display device of claim 1, wherein, when viewed from a direction perpendicular to an upper surface of the third gate electrode, an area of the second gate insulating portion is the same as an area of a portion of the third gate electrode overlapping the third active region.

4. The organic light-emitting display device of claim 1, wherein, when viewed from a direction perpendicular to an upper surface of the third gate electrode, an area of the second gate insulating portion is larger than an area of a portion of the third gate electrode overlapping the third active region.

5. The organic light-emitting display device of claim 1, wherein the number of oxygen atoms per unit volume in the second gate insulating portion is greater than the number of oxygen atoms per unit volume in the first gate insulating portion.

6. The organic light-emitting display device of claim 1, further comprising:
   a fourth transistor connected between the first node and a fourth voltage line and configured to initialize a voltage of the first gate electrode in response to a voltage applied to a fourth gate electrode; and
   a third gate insulating portion interposed between a fourth active region of the fourth transistor and the fourth gate electrode, wherein the number of oxygen atoms per unit volume in the first gate insulating portion is different from a number of oxygen atoms per unit volume in the third gate insulating portion.

7. The organic light-emitting display device of claim 6, wherein the third gate insulating portion overlaps the fourth gate electrode and the fourth active region.

8. The organic light-emitting display device of claim 6, wherein, when viewed from a direction perpendicular to an upper surface of the fourth gate electrode, an area of the third gate insulating portion is the same as an area of a portion of the fourth gate electrode overlapping the fourth active region.

9. The organic light-emitting display device of claim 6, wherein, when viewed from a direction perpendicular to an upper surface of the fourth gate electrode, an area of the third gate insulating portion is larger than an area of a portion of the fourth gate electrode overlapping the fourth active region.

10. The organic light-emitting display device of claim 6, wherein the number of oxygen atoms per unit volume in the third gate insulating portion is greater than the number of oxygen atoms per unit volume in the first gate insulating portion.

11. The organic light-emitting display device of claim 1, further comprising:
    a seventh transistor connected between the organic light-emitting diode and a fourth voltage line and configured to initialize a voltage of a pixel electrode of the organic light-emitting diode in response to a voltage applied to a seventh gate electrode; and
    a fifth gate insulating portion interposed between a seventh active region of the seventh transistor and the seventh gate electrode, wherein the number of oxygen atoms per unit volume in the first gate insulating portion is different from a number of oxygen atoms per unit volume in the fifth gate insulating portion.

12. The organic light-emitting display device of claim 11, wherein the fifth portion overlaps the seventh gate electrode and the seventh active region.

13. The organic light-emitting display device of claim 11, wherein, when viewed from a direction perpendicular to an upper surface of the seventh gate electrode, an area of the fifth portion is the same as an area of a portion of the seventh gate electrode overlapping the seventh active region.

14. The organic light-emitting display device of claim 11, wherein, when viewed from a direction perpendicular to an upper surface of the seventh gate electrode, an area of the fifth portion is larger than an area of a portion of the seventh gate electrode overlapping the seventh active region.

15. The organic light-emitting display device of claim 11, wherein the number of oxygen atoms per unit volume in the fifth portion is greater than the number of oxygen atoms per unit volume in the first gate insulating portion.

* * * * *